United States Patent [19]
Merritt et al.

[11] Patent Number: 5,732,036
[45] Date of Patent: Mar. 24, 1998

[54] MEMORY DEVICE COMMUNICATION LINE CONTROL

[75] Inventors: Todd A. Merritt; Donald M. Morgan, both of Boise, Id.

[73] Assignee: Micron Technology, Inc., Boise, Id.

[21] Appl. No.: 801,125

[22] Filed: Feb. 14, 1997

[51] Int. Cl.[6] ................................................ G11G 7/00
[52] U.S. Cl. .................................... 365/203; 365/149
[58] Field of Search .............................. 365/203, 204, 365/189.01, 190, 149

[56] References Cited

U.S. PATENT DOCUMENTS

| | | | |
|---|---|---|---|
| 4,802,129 | 1/1989 | Hoekstra et al. | 365/203 |
| 4,903,238 | 2/1990 | Miyatake et al. | 365/203 |
| 4,996,671 | 2/1991 | Suzuki et al. | 365/203 |
| 5,233,560 | 8/1993 | Foss et al. | 365/203 |
| 5,495,449 | 2/1996 | Park | 365/203 |
| 5,546,338 | 8/1996 | Proebsting | 365/203 |

OTHER PUBLICATIONS

"Micron 4 MEG X 4/2 MEG X 8 SDRAM", *Micron Synchronous DRAM Data Book*, Micron Technology, Inc., 1–44, (Rev. Feb. 1997).

Primary Examiner—Tan T. Nguyen
Attorney, Agent, or Firm—Schwegman, Lundberg, Woessner & Kluth, P.A.

[57] ABSTRACT

A memory device is described which equilibrates and precharges the input/output lines synchronously during a write cycle and asynchronously during a read cycle. During a read cycle, the timing of equilibration and precharge functions are decoupled from the clock signal and asynchronously initiate the equilibrate and precharge functions of the I/O lines in response to a latch signal. The invention initiates the equilibration and precharging of the I/O lines earlier in the access cycle thereby increasing memory access speed.

18 Claims, 6 Drawing Sheets

5,732,036

MEMORY DEVICE COMMUNICATION LINE CONTROL

TECHNICAL FIELD OF THE INVENTION

This invention relates generally to the field of synchronous memory devices, and more particularly to controlling data communication lines of a memory device in order to speed memory operation.

BACKGROUND OF THE INVENTION

Integrated circuit memory devices such as synchronous dynamic random access memory devices (SDRAMs) have thousands of memory cells. Each memory cell is capable of storing data in the form of an electric charge. In order to read the data in a particular memory cell, the memory cell is selectively coupled to a sense circuit via a communication line, commonly referred to as a digit line. Typically, the sense circuit is connected to a pair of digit lines and detects a voltage differential between the digit lines caused by the stored charge. Prior to coupling a memory cell to a digit line, the pair of digit lines are equilibrated to a predetermined voltage level. After the sense circuit amplifies the voltage differential on the pair of digit lines, the digit lines are coupled to data input/output (I/O) communication lines for data communication with external devices. In order to accelerate the read operation, and to minimize operational power consumption, the I/O lines of the SDRAM are typically equilibrated and precharged to an initial predetermined voltage, such as one half a supply voltage (Vcc/2). This allows the I/O lines to quickly develop a differential voltage when coupled to the amplified digit lines.

The internal operations of an SDRAM, including equilibrating the I/O lines, are tightly synchronized by an externally provided clock signal. For example, the I/O lines are typically equilibrated at a precise time during a memory access cycle. Therefore, the access time of the SDRAM is directly affected by the time at which the I/O lines are equilibrated during the access. In order to reduce the access time, there is a need in the art for a synchronous memory device which initiates the equilibration of the I/O lines as early in the access cycle as possible. More specifically, there is a need in the art for a memory device that, when possible, decouples the timing of the equilibration operation from the clock signal and effectively asynchronously initiates the equilibration of the I/O lines.

SUMMARY OF THE INVENTION

The above-mentioned problems with synchronous memory devices and other problems are addressed by the present invention and which will be understood by reading and studying the following specification. An equilibrate and precharge circuit is described which allows a faster read operation in a synchronous memory.

In particular, the present invention describes a synchronous memory comprising internal data communication lines, and equilibrate and precharge circuitry coupled to the internal data communication lines for precharging and equilibrating the internal data communication lines to a predetermined voltage in response to an externally provided clock signal during a write operation, and in response to an internally generated signal during a read operation.

In another embodiment, a synchronous memory device is described which comprises memory cells for storing data, digit lines coupled to receive data stored in the memory cells and data communication lines selectively coupled to the plurality of digit lines. A data latch circuit is coupled to the data communication lines for latching the stored data in response to a data latch signal. Further, an equilibration circuit is coupled to the data communication lines for equilibrating the data communication lines to a common voltage in response to an external clock signal during a memory write operation and equilibrating the data communication lines in response to the data latch signal during a memory read operation.

In yet another embodiment, a method of accessing a synchronous memory device is described. The method comprises the steps of initiating a memory access, equilibrating the I/O lines in response to an internal data latch signal if the memory access cycle is a read access, and equilibrating the I/O lines in response to an external clock signal if the memory access is a write access.

DETAILED DESCRIPTION OF THE INVENTION

In the following detailed description, references are made to the accompanying drawings which illustrate specific embodiments in which the invention may be practiced. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

Figure 1:
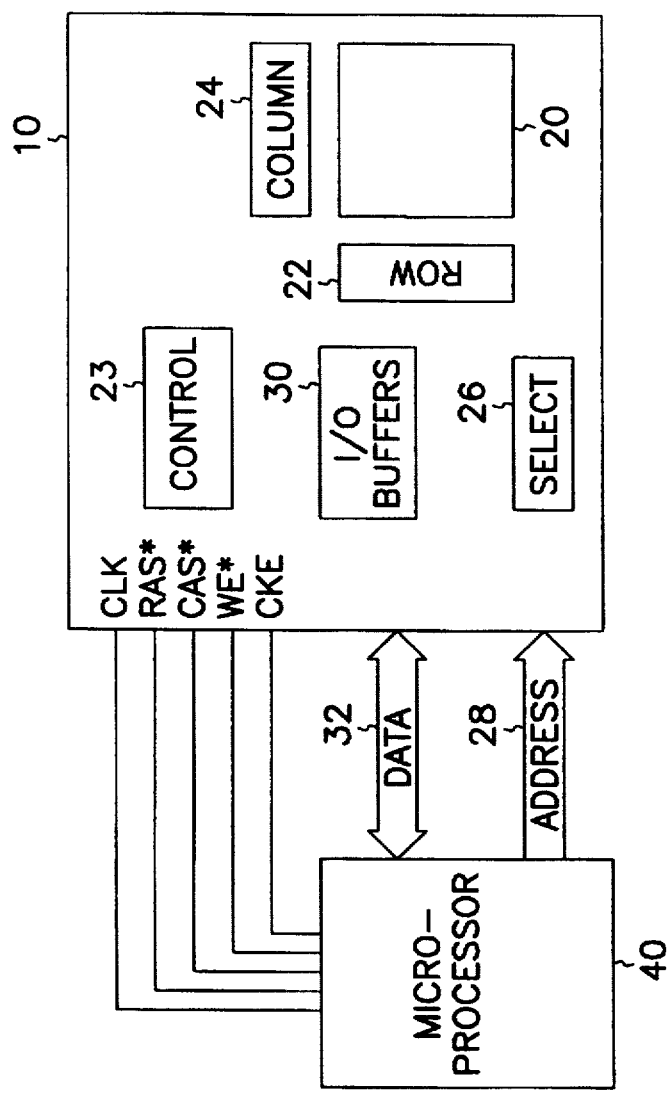
FIG. 1 is a block diagram of one embodiment of a memory device incorporating the present invention.

FIG. 1 illustrates a memory device 10 of the present invention. The memory device 10 can be any type of memory, but is preferably an SDRAM. The SDRAM has an array of dynamic memory cells arranged in at least one addressable memory bank 20. The memory cells are accessed in response to address signals provided on address lines 28 using row 22 and column 24 decode circuitry. Input/output buffers 30 are provided for bi-directional data communication via data communication lines 32. Control circuitry 23 regulates the SDRAM operations in response to control signals which include, but are not limited to, a Clock (CLK), Row Access Strobe (RAS*), Column Access Strobe (CAS*), Write Enable (WE*), and Clock Enable (CKE). An external processor 40 is provided for both bi-directional data communication and control with the memory. The memory of FIG. 1 has been simplified for illustrating the features of the present invention and is not intended to describe all of the elements and features of an SDRAM. For a more detailed description of the operation of a SDRAM see Micron Technology, Inc. 1997 Synchronous DRAM data book, February 1997, pages 1-44 for a description of a 4 MEG×4/2 MEG×8 SDRAM.

Figure 2:
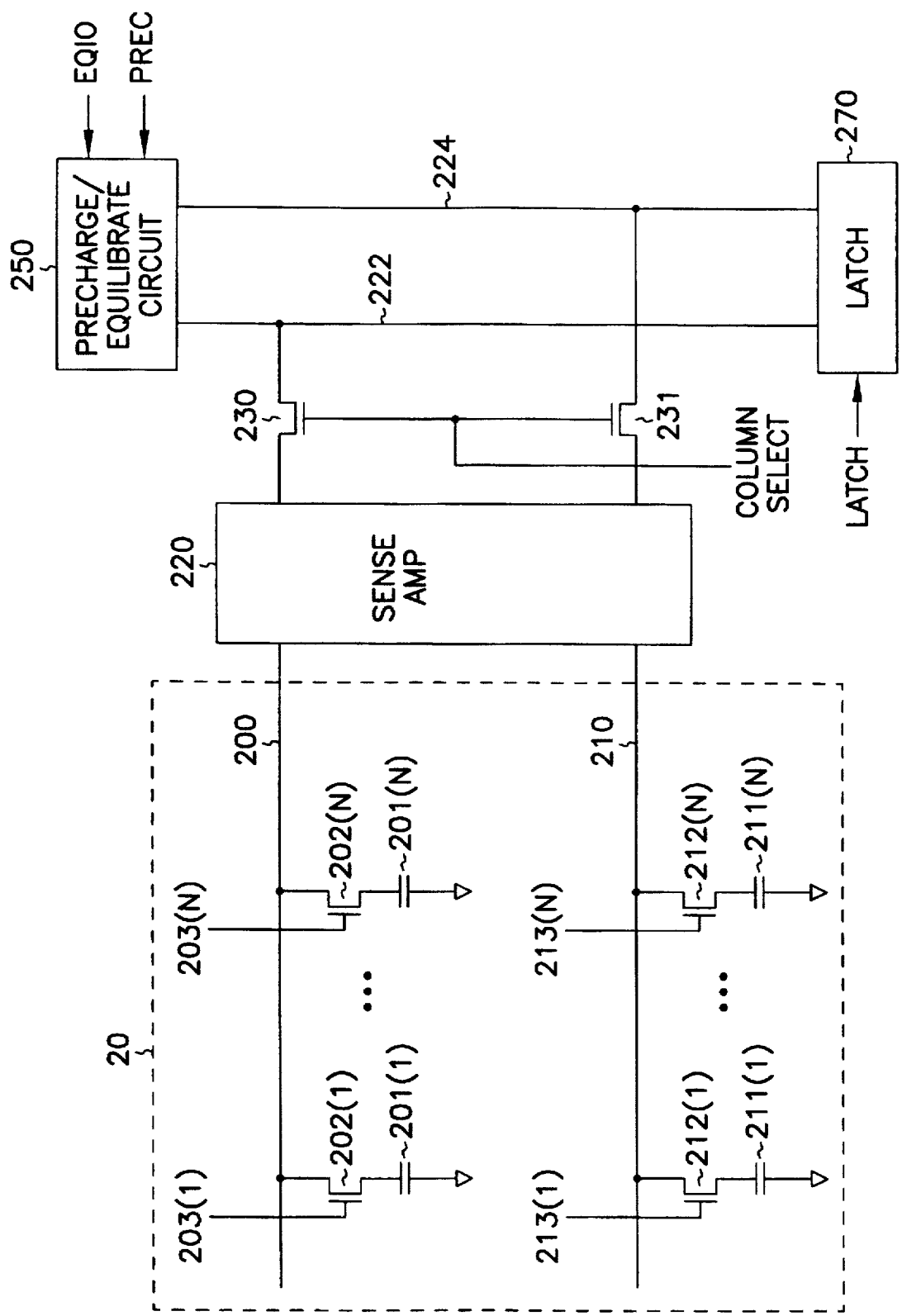
FIG. 2 is a diagram of a portion of the memory device of FIG. 1.

FIG. 2 is a block diagram of a portion of memory device 10. Referring to FIG. 2, memory bank 20 has a plurality of storage capacitors 201(1) through 201(N) which are coupled to digit line 200 by corresponding access transistors 202(1) through 202(N). Each access transistor 202(1) through 202(N) is controlled by a word line 203(1) through 203(N) respectively. In a similar configuration, memory device 10 has a plurality of storage capacitors 211(1) through 211(N) which are coupled to digit line 210 by access transistors 212(1) through 212(N). Access transistors 212(1) through 212(N) are controlled by word lines 213(1) through 213(N). In this manner, digit lines 200 and 210 form a digit line pair.

Sense amplifier 220 is coupled to the digit line pair formed by digit lines 200 and 210 and provides an amplified signal to input/output (I/O) lines 222 and 224 via transistors 230 and 231. The column select line governs the coupling of sense amplifier 220 to I/O lines 222 and 224 by controlling isolation transistors 230 and 231. The configuration of digit lines 200 and 210 and sense amplifier 220 is typically referred to as a folded digit line structure since both digit lines 200 and 210 originate from the same direction. Alternatively, in another embodiment, an open digit line structure may be used where digit lines 200 and 210 come from opposite directions with sense amplifier 220 located therebetween.

Precharge/equilibrate circuit 250 is responsible for precharging and equilibrating I/O lines 222 and 224 to a predetermined voltage. In one embodiment, the predetermined voltage is Vcc/2 where Vcc is the logic "true" voltage of memory device 10. The precharging and equilibrating operations of I/O lines 222 and 224 are triggered by a precharge signal (PREC) and an equilibrate I/O signal (EQIO). As will be explained in detail below, the PREC and EQIO lines are synchronized with an external clock signal during a write access; however, PREC and EQIO lines are asynchronously triggered by a LATCH signal during a read operation.

Latch 270 is coupled to I/O lines 222 and 224 and is triggered by a LATCH signal. Thus, the data present on I/O lines 222 and 224 is latched when latch 270 receives the LATCH signal. Furthermore, latch 270 is self-isolating such that upon latching the data, latch 270 electrically isolates itself from I/O lines 222 and 224. At this point, I/O lines 222 and 224 may be equilibrated and precharged without disrupting data in latch circuit 270. Latch 270 can then be coupled to an output driver circuit (not shown) which drives data lines 32.

Figure 3:
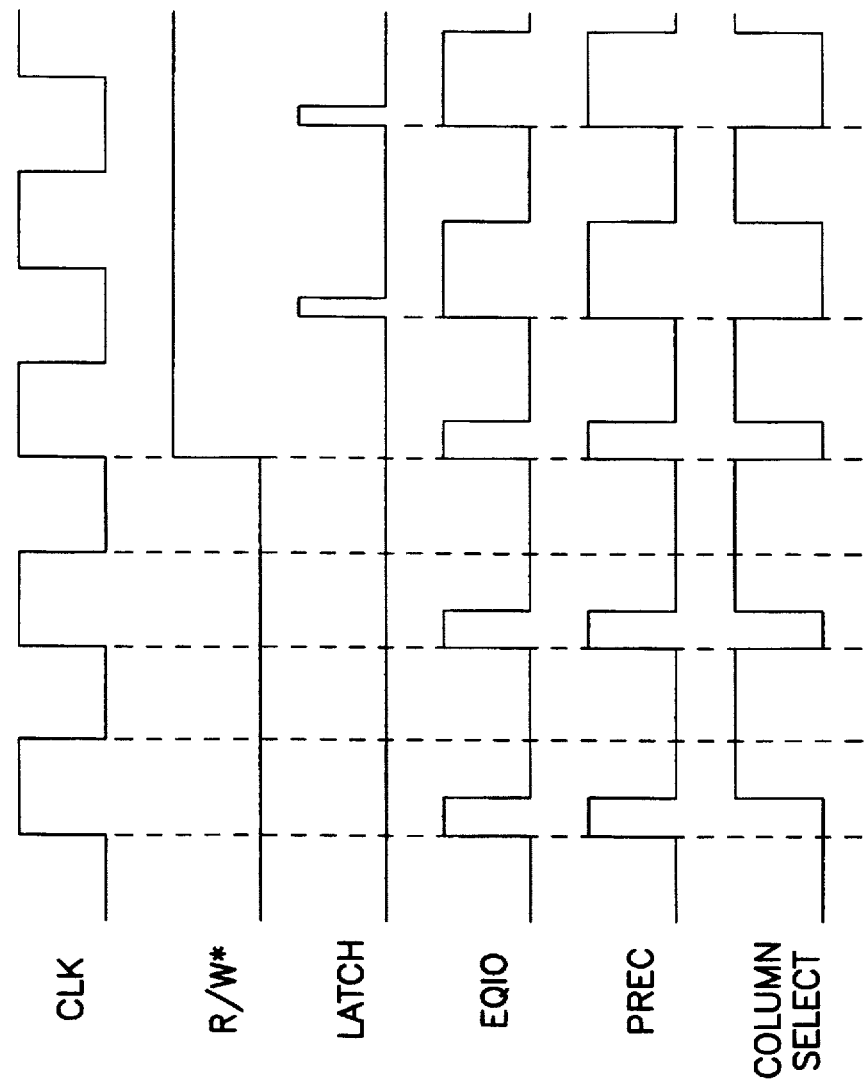
FIG. 3 is a timing diagram illustrating the operation of the portion of the memory device depicted in FIG. 2.

FIG. 3 is a timing diagram illustrating the operation of the portion of memory device 10 depicted in FIG. 2. More specifically, FIG. 3 illustrates how memory device 10 asynchronously equilibrates and precharges the I/O lines earlier in the access cycle whenever possible. FIG. 3 is intended to demonstrate the states of certain electronic signals within memory device 10 as memory bank 20 is accessed. FIG. 3 is not intended to depict the absolute timing of the signals in an SDRAM incorporating the present invention.

FIG. 3 shows five access cycles of memory device 10. These cycles are represented by the CLK signal which is illustrated as a conventional square wave. Each cycle of the CLK signal corresponds to one access of memory device 10. The Read/Write (R/W*) signal indicates whether a read access or a write access is to be performed during the clock cycle. Thus, a low R/W* signal indicates a write operation, and a high signal indicates a read operation. As illustrated, the first and second clock cycles are write accesses while the third and fourth clock cycles are read accesses.

Equilibration/Precharging for a Write Access

During a write cycle, the equilibration and the precharging of the I/O lines are synchronized with the clock signal. As illustrated in FIG. 3, short pulses on PREC and EQIO trigger the precharging and the equilibration of I/O lines 222 and 224. These pulses occur near the beginning of the write cycle at a predefined time after the rising edge of the clock. When the precharging of the I/O lines is complete, the column select is activated and is maintained until the precharge signal is received during the next access cycle. As illustrated in FIG. 3, the column select is maintained for nearly the entire write cycle. It will be recognized by those skilled in the art that the data is written to selected memory cells during the column select activation period.

Equilibration/Precharging for a Read Access

During a read cycle, the equilibration and precharging of the I/O lines may not necessarily be synchronized with the clock signal depending upon the previous access. During the first read access, the third clock cycle of FIG. 3, the equilibration and precharging operations of the I/O lines occur near the beginning of the access cycle. As described above, the LATCH signal triggers latch 270 to latch the data provided by I/O lines 222 and 224. Upon the rising edge of LATCH, latch 270 latches the data and electrically isolates itself from I/O lines 222 and 224, described in detail below. Since the data is latched by latch 270 and I/O lines 222 and 224 are electrically isolated from latch 270, the precharging and equilibrating operations of I/O lines 222 and 224, which normally do not occur until the next access cycle, may be initiated. In summary, the rising edge of LATCH during a read access causes the precharging and equilibration operations of the I/O lines to be asynchronously initiated earlier in the access cycle. One advantage is that the next access cycle may immediately begin preparing memory bank 20 for access. Therefore, the next access cycle is accelerated because it need not wait for the typical equilibration and precharge of the I/O lines 222 and 224. Another advantage is that the column select is deactivated earlier in a read cycle which prohibits sense amp 220 from completely driving I/O lines 222 and 224 to opposite voltage levels. Thus, the precharging of I/O lines 222 and 224 to a predetermined voltage, such as Vcc/2, is accelerated since the I/O lines are not driven completely to logic "true" (Vcc) and logic "false" (ground) potentials. Latch 270, upon latching the data from I/O lines 222 and 224, finishes driving the data to Vcc and ground. It will be appreciated by those skilled in the art that a substantial reduction in memory current demand is achieved. Asynchronously, as used herein, describes an operation which is not tightly synchronized to an external clock, but activated instead by an internal signal.

Figure 4:
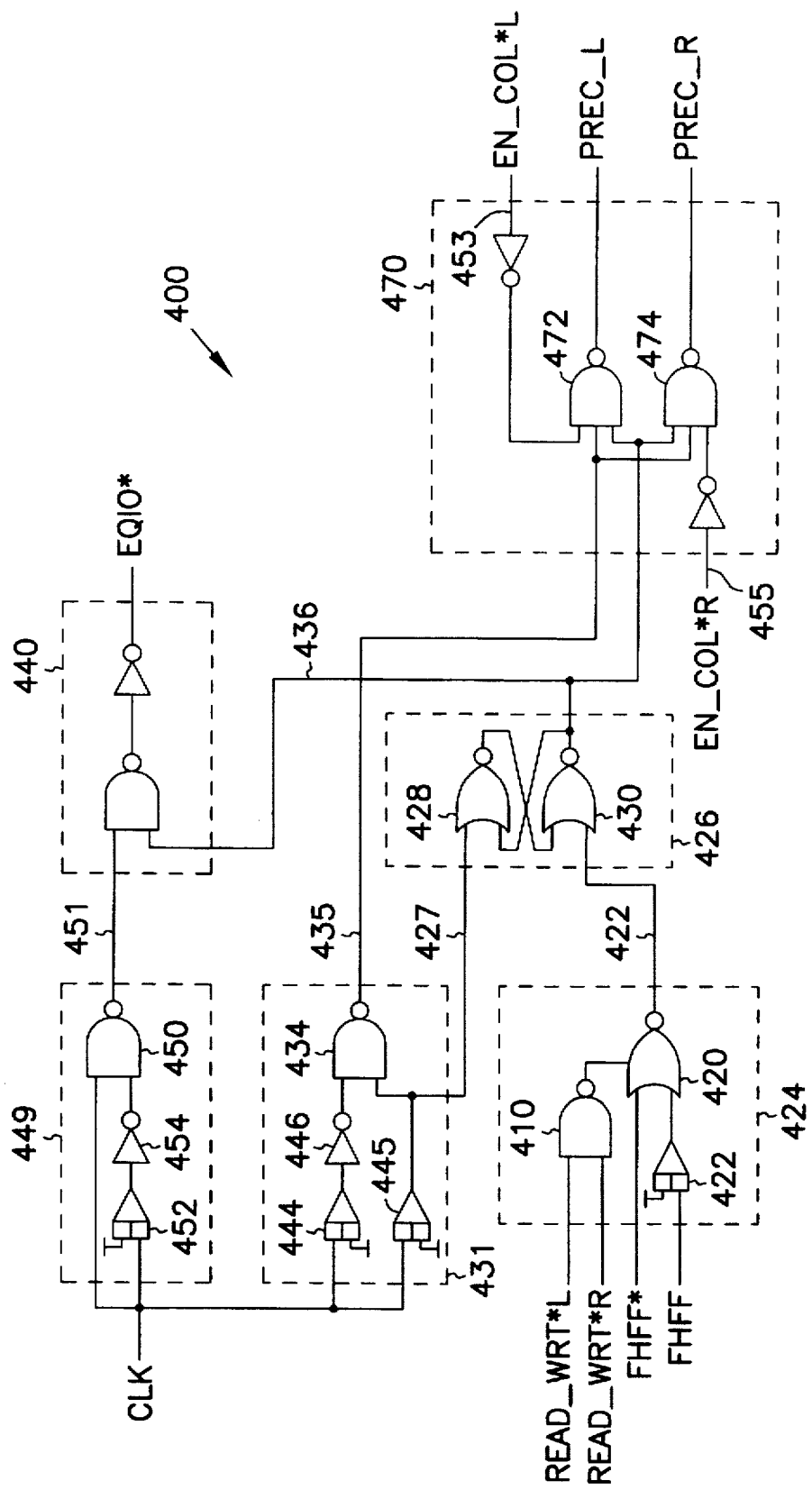
FIG. 4 is one embodiment of precharge and equilibrate control circuitry of the memory.

FIG. 4 illustrates one embodiment of a control circuit which asynchronously precharges and equilibrates the input/output lines during a read access. As illustrated in FIG. 4, control circuit 400 is designed for an SDRAM having two memory banks, a left memory bank and a right memory bank. Accordingly, control circuit 400 generates EQIO, Precharge Left (PREC_L) and Precharge Right (PREC_R) signals. The PREC_L signal activates the precharging circuitry for the input/output lines of the left memory bank. Similarly, the PREC_R signal activates the precharging circuitry for the input/output lines of the right memory bank.

Control circuit 400 receives five input signals, clock (CLK), left read/write (READ_WRT*L), right read/write (READ_WRT*R), and complimentary helper flip-flop signals (FHFF and FHFF*). The CLK input is a conventional clock signal. The READ_WRT*L input is low (ground) when the left memory bank is being accessed, either by a read access or by a write access. Similarly, the READ_WRT*R input is low when the right memory bank is being accessed. A pulse signal on the FHFF input indicates that latch 270 has latched data provided on the I/O lines from the two memory banks. The FHFF* signal is simply the logical inverse of FHFF.

NAND gate 410, NOR gate 420, and delay element 422 form pulse generator 424 which is active during a read cycle. NAND gate 410 is used to enable NOR gate 420. It will be appreciated that NOR gate 420 need only be enabled during read operations, thus the READ_WRT*L and READ_WRT*R signals, and NAND gate 410 can be replaced with other enable circuits and signals to enable NOR gate 420 during read operations. Pulse generator 424 generates a latch pulse at node 422 indicating that data has successfully been latched from the I/O lines. During an access of the memory banks, NOR gate 420 is enabled since either the READ_WRT*L or READ_WRT*R signal will be low. Since NOR gate 420 receives FHFF* and a delayed version of FHFF, the output of NOR gate 420 is high only for the length of the delay introduced by delay element 422 when the FHFF signal transitions from low to high. In this manner, pulse generator 424 outputs a latch pulse signal 422 of a predetermined length when I/O data has been latched from the input/output lines during a read cycle.

Pulse generator 431 is provided to generate an equilibration timing pulse at node 435 which is synchronized to the clock signal and which triggers a precharge operation of the I/O lines of the memory device. Similarly, pulse generator 449 is provided to generate a precharge timing pulse at node 451 which is synchronized to the clock signal but which triggers the equilibration operation of the I/O lines of the memory device. More specifically, pulse generator 431 comprises NAND gate 434, inverter 446, delay element 444 and delay element 445. Pulse generator 449 comprises NAND gate 450, delay element 452 and inverter 454. The output of pulse generators 431 and 449 are produced by NAND gates 434 and 450, respectively, and are high for the majority of the access cycle except for a short low voltage pulse near the beginning of the access cycle when the clock signal transitions from a low to high state. The duration of the low voltage pulse generated by NAND gate 434 is controlled by delay elements 444 and 445. Similarly, the duration of the low voltage pulse generated by NAND gate 450 is controlled by delay element 452. As explained in further detail below, pulse generators 431 and 449 synchronize the precharging and equilibrating of the I/O lines with the clock signal.

Latch circuit 426 asynchronously initiates precharging and equilibrating of the I/O lines when a short pulse is received on node 422 from pulse generator 424 indicating that data has been successfully latched from the I/O lines during a read cycle. Latch circuit 426 is reset at the beginning of each access cycle by the rising edge of the clock via node 427. More specifically, latch circuit 426 comprises NOR gate 428 and NOR gate 430 which each have first and second inputs, 422 and 427. The first input of NOR gate 430 is connected to the pulse signal output 422 of pulse generator 424 and the second input of NOR gate 430 is connected to the output of NOR gate 428. The first input of NOR gate 428 is coupled to the CLK input through delay element 445 at node 427. The second input of NOR gate 428 is connected to the output of NOR gate 430. At the beginning of the access cycle, READ_WRT*L or READ_WRT*R will be low causing NAND gate 410 to output a high signal enabling NOR gate 420 to output a low signal on node 422. After the rising edge of the clock signal, the output of NOR gate 428 is driven low which together with the low level on node 422 sets the output of NOR gate 430 to a high state. In this manner, the beginning of a clock cycle resets latch circuit 426 to a first state in which the output 436 of latch circuit 426 is at a high state. The output of latch circuit 426 will only transition to a low state if data has been latched from the I/O lines during a read cycle, thereby asynchronously initiating the precharging and equilibrating of the input/output lines. That is, node 436 will transition low when node 422 transitions high in response to FHFF. Precharge output circuit 470 produces two precharge output signals (PREC_L and PREC_R) which initiate the precharging of the right memory bank and the left memory bank according to the output 435 from pulse generator 431, the output 436 of latch circuit 426 and the enable column inputs 453 and 455 (EN_COL*L and EN_COL*R). The precharging of the I/O lines is synchronously initiated by a precharge timing pulse on node 435 from pulse generator 431 during a write cycle and a first read cycle, and asynchronously initiated by a latch pulse signal at node 436 from latch circuit 426 during a read cycle. Precharge output circuit 470 includes NAND gate 472 and NAND gate 474. Each NAND gate is connected to receive an enable signal. Thus, when a column in either the left or right memory bank is selected, the enable input is high. If no column is selected, the input is low to force the output of the NAND to a high state.

Equilibrate output circuit 440 produces an equilibrate signal (EQIO*) which initiates an equilibration operation of the I/O lines according to the outputs of pulse generator 449 and latch circuit 426. In this configuration, equilibration of the I/O lines is synchronously initiated by pulse generator 449 during a write cycle and the first read cycle, and asynchronously initiated by latch circuit 426 during a subsequent read cycle.

Figure 5:
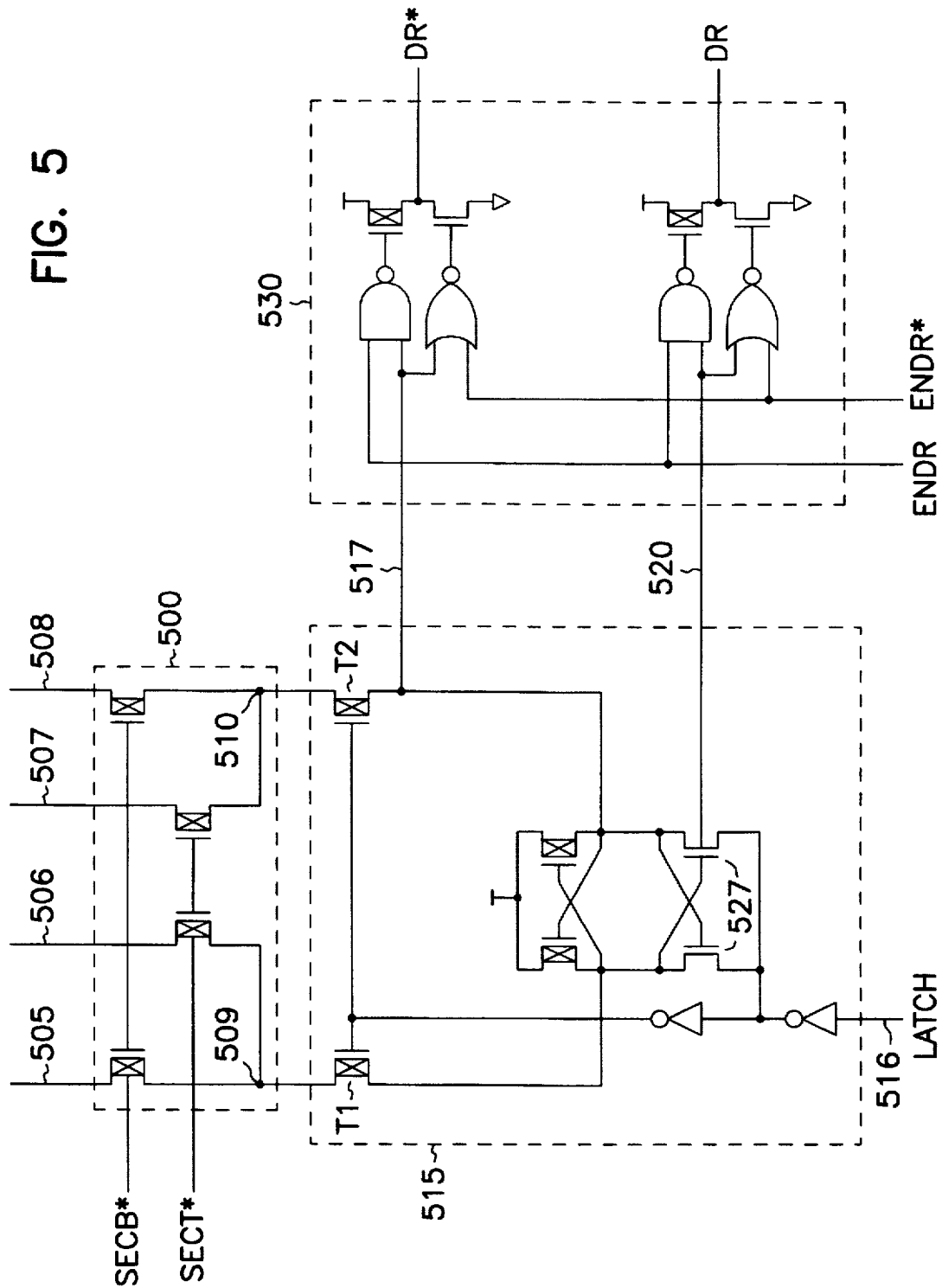
FIG. 5 illustrates one embodiment of a self-isolating latch of the memory.

FIG. 5 illustrates one embodiment of a self-isolating latch which facilitates the asynchronous equilibration and precharging of the input/output lines. As shown in FIG. 5, multiplexer 500 is connected to I/O lines 505, 506, 507 and 508. These I/O lines are intended to be the same as the above described I/O lines 222 and 224. Multiplexer 500 is a 4:2 multiplexer such that either the data on I/O lines 506 and 507, or the data on I/O lines 505 and 508 is passed to outputs 509 and 510 according to selection signals SECB* and SECT*.

Latch 515 receives the data present on outputs 509 and 510 of multiplexer 500 and latches the data when triggered by the latch (LATCH) signal provided at node 516. After latching the data, a first output 517 and a second output 520 of latch 515 provide the data to output driver 530 which has conventional logic for driving the data to external devices.

When the LATCH signal is low, transistors T1 and T2 are active such that latch 515 is coupled to multiplexer 500. A low to high transition of the LATCH signal deactivates transistors T1 and T2 thereby isolating latch 515 from multiplexer 500. At the same time, the sources of transistors 527 are coupled low and nodes 517 and 520 are driven to the appropriate voltage level in response to the data on the I/O lines. The Latch circuit 515, therefore, latches and isolates in response to a single signal, referred to herein as self-isolating. The self-isolating feature of latch 515 allows the I/O lines to be equilibrated and precharged earlier in the access cycle without effecting the output data. Output 520 of latch 515 provides data latched from output 509 of multiplexer 500. Output 517 of latch 515 provides the data latched from output 510 of multiplexer 500. When a high voltage is present on Enable Driver signal (ENDR) and a low voltage is present on its complement signal (ENDR*), output driver 530 drives data to external devices.

Figure 6:
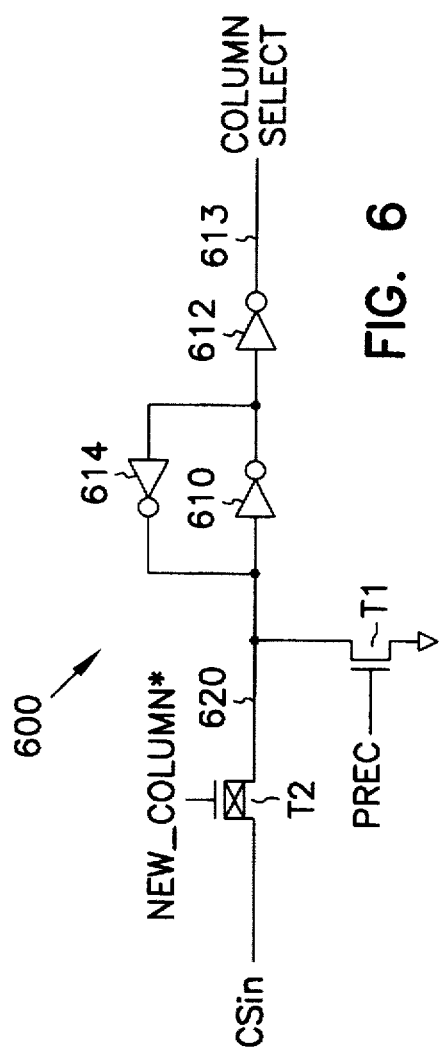
FIG. 6 is one embodiment of a column select control circuit of the memory.

FIG. 6 is one embodiment of a column select control which responds to the synchronous and asynchronous precharging of I/O lines 222 and 224 of FIG. 2. As illustrated in FIG. 6, invertors 610 and 614 of column select control circuit 600 form a latch to store the last state of node 620 which is buffered and driven by invertors 610 and 612 as the Column Select signal 613. During an access cycle, input signal New_Column* momentarily drives the gate of transistor T2 low activating the transistor to sample the state of Csin to be latched on node 620. If the associated column is to be selected, Csin will be high causing the Column Select output 613 to drive high as depicted in FIG. 3. The gate of transistor T1 is connected to the precharge signal (PREC in FIG. 2). PREC is produced as described in FIG. 4 for PREC_L or PREC_R. When the PREC signal is low, precharging is not occurring and transistor T1 is deactivated. In this state, the latched sample of signal CSIN passes to the output column select signal at node 613 via invertors 610 and 612. As illustrated in FIG. 2, the output column select signal activates isolation transistors 230 and 231 thereby coupling sense amplifier 220 to I/O lines 222 and 224

When the precharge operation of the I/O lines 222 and 224 is initiated, the PREC signal activates transistor T1 which couples node 620 to ground. This inhibits the output column select and deactivates transistors 230 and 231 which effectively isolate I/O lines 222 and 224. In this manner, column select control circuit 600 lowers the column select signal and isolates I/O lines 222 and 224 when precharging of the I/O lines begins, whether synchronously or asynchronously initiated.

Conclusion

Various embodiments of a memory device have been described which synchronously equilibrates and precharges I/O lines during a write access and asynchronously equilibrates and precharges the I/O lines during a read access upon the latching of data provided on the I/O lines. During a read cycle, the timing of equilibration and precharge functions are decoupled from the clock signal and asynchronously initiate the equilibrate and precharge functions of the I/O lines in response to a latch signal. This method of control is suitable for a wide variety of memory devices but is particularly suitable for an SDRAM because of the critical timing requirements. This application is intended to cover any adaptations or variations of the present invention. It is manifestly intended that this invention be limited only by the claims and equivalents thereof.

What is claimed is:

1. A synchronous memory comprising:

internal data communication lines; and equilibrate and precharge circuitry coupled to the internal data communication lines for precharging and equilibrating the internal data communication lines to a predetermined voltage in response to an externally provided clock signal during a write operation, and in response to an internally generated signal during a read operation.

2. A synchronous memory device comprising:

a plurality of memory cells for storing data;

a plurality of digit lines coupled to receive data stored in the memory cells;

a plurality of data communication lines selectively coupled to the plurality of digit lines;

a data latch circuit coupled to the data communication lines for latching the stored data in response to a data latch signal; and an equilibration circuit coupled to the data communication lines for equilibrating the data communication lines to a common voltage in response to an external clock signal during a memory write operation and equilibrating the data communication lines in response to the data latch signal during a memory read operation.

3. The synchronous memory device of claim 2 further comprising:

a precharge circuit coupled to the data communication lines for precharging the data communication lines to a predetermined voltage in response to the external clock signal during a memory write operation and precharging the data communication lines in response to the data latch signal during a memory read operation.

4. The synchronous memory device of claim 3 wherein the precharge circuit comprises:

a first pulse generator for providing an output latch signal indicating that data has been latched from the data communication lines during a read cycle;

a second pulse generator for providing an output signal in response to the external clock;

a latch circuit connected to receive the output latch signal of the first pulse generator and the external clock signal, the latch circuit transition from a first state to a second state in response to the output latch signal, and resetting to the first state in response to a subsequently received transition of the external clock signal; and a precharge output circuit connected to the second pulse generator and the latch circuit, the precharge output circuit generating a precharge signal in response to either a transition of the external clock signal when the latch circuit is in the first state, or the latch circuit transitioning from the first state to the second state.

5. The synchronous memory device of claim 2 wherein the data latch circuit comprises isolation circuitry to electrically isolate the latch from the data communication lines during a read operation in response to the data latch signal.

6. The synchronous memory device of claim 2 wherein the memory device is a synchronous dynamic random access memory (SDRAM).

7. The synchronous memory device of claim 2 wherein the equilibrate circuit comprises:

a first pulse generator for providing an output latch signal indicating that data has been latched from the data communication lines during a read cycle;

a second pulse generator for providing an output signal in response to the external clock;

a latch circuit connected to receive the output latch signal of the first pulse generator and the external clock signal, the latch circuit transition from a first state to a second state in response to the output latch signal, and resetting to the first state in response to a subsequently received transition of the external clock signal; and an equilibrate output circuit connected to the second pulse generator and the latch circuit, the equilibrate output circuit generating an equilibrate signal in response to either a transition of the external clock signal when the latch circuit is in the first state, or the latch circuit transitioning from the first state to the second state.

8. A system comprising:

a synchronous memory comprising:

a plurality of memory cells for storing data, a digit line pair connected to the memory cells, a plurality of sense amplifier, each sense amplifier connected to the digit line pair for amplifying a voltage differential on the digit line pair, a plurality of input/output (I/O) lines selectively coupled to the digit line pair, a data latch connected to the plurality of I/O lines for latching the stored data in response to a data latch signal, an equilibration circuit coupled to the I/O lines for synchronously equilibrating the I/O lines in response to an external clock signal during a memory write operation and in asynchronously equilibrating the I/O lines in response to the data latch signal during a memory read operation; and a microprocessor coupled to the synchronous memory.

9. The system of claim 8 wherein the synchronous memory further comprises:

a precharge circuit coupled to the I/O lines for synchronously precharging the I/O lines to a predetermined voltage in response to the external clock signal during a memory write operation and asynchronously precharging the I/O lines in response to the data latch signal during a memory read operation.

10. The system of claim 8 wherein the I/O lines are selectively coupled to the plurality of digit lines by a column select circuit.

11. The system of claim 8 wherein the latch comprises isolation circuitry to electrically isolate the latch from the I/O lines during a read signal in response to the data latch signal.

12. The system of claim 8 wherein the synchronous memory is a synchronous memory device.

13. A method of accessing a synchronous memory device having a plurality of memory cells arranged in an array of rows and columns and a plurality of input/output lines, the method comprising the steps of:

initiating a memory access;

equilibrating the I/O lines in response to an internal data latch signal if the memory access cycle is a read access; and equilibrating the I/O lines in response to an external clock signal if the memory access is a write access.

14. The method of claim 13 further comprising the steps of:

precharging the I/O lines in response to the data latch signal if the memory access cycle is a read access; and precharging the I/O lines in response to the external clock signal if the memory access is a write access.

15. A method of accessing a synchronous memory device having a plurality of memory cells, the method comprising the steps of:

initiating a memory read function;

asynchronously generating a precharge signal and an equilibrate signal during the read function;

initiating a memory write function; and synchronously generating the precharge signal and the equilibrate signal during the memory mite function.

16. The method of claim 15 wherein the step of asynchronously generating a precharge signal and an equilibrate signal comprises the sub-steps of:

latching data during a prior read operation;

generating a latch signal indicating that the data has been latched; and generating the precharge signal and the equilibrate signal in response to the latch signal using a control circuit.

17. The method of claim 16 further comprising the step of:

blocking an external clock signal from generating the precharge signal and the equilibrate signal.

18. The method of claim 17 wherein the step of synchronously generating a precharge signal and an equilibrate signal comprises the sub-steps of:

resetting the control circuit to respond to the external clock signal; and generating the precharge signal and the equilibrate signal in response to the external clock signal using the control circuit.

* * * * *

UNITED STATES PATENT AND TRADEMARK OFFICE
CERTIFICATE OF CORRECTION

PATENT NO. : 5,732,036
DATED : March 24, 1998
INVENTOR(S) : Todd A. Merritt and Donald M. Morgan

It is certified that error appears in the above-indentified patent and that said Letters Patent is hereby corrected as shown below:

Column 10, Line 16, delete "mite", insert -- write --

Signed and Sealed this

Fourth Day of August, 1998

Attest:

Attesting Officer

BRUCE LEHMAN

Commissioner of Patents and Trademarks